(12) United States Patent
Glenn

(10) Patent No.: US 6,601,293 B1
(45) Date of Patent: Aug. 5, 2003

(54) METHOD OF MAKING AN ELECTROMAGNETIC INTERFERENCE SHIELD DEVICE

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/551,416

(22) Filed: Apr. 18, 2000

Related U.S. Application Data

(62) Division of application No. 09/141,936, filed on Aug. 28, 1998, now Pat. No. 6,092,281.

(51) Int. Cl.[7] .............................................. H05K 3/30
(52) U.S. Cl. .......................... 29/841; 29/832; 174/52.4; 257/687; 257/691; 257/701; 361/761; 361/764; 361/794
(58) Field of Search ......................... 29/832, 841, 846, 29/852; 438/209, 211, 212, 213, 214–224; 257/55, 701, 687, 691; 174/35 R, 255, 256, 257, 261, 262, 260, 52.4; 361/760–761, 764, 767, 772, 794, 784, 792

(56) References Cited

U.S. PATENT DOCUMENTS

| | | | |
|---|---|---|---|
| 4,530,152 A | 7/1985 | Roche et al. .................. 29/588 |
| 4,691,225 A | 9/1987 | Murakami et al. ............. 357/80 |
| 4,801,998 A | 1/1989 | Okuaki ......................... 357/72 |
| 4,814,943 A | 3/1989 | Okuaki ......................... 361/400 |
| 4,957,593 A | 9/1990 | Shaw et al. .................... 204/231 |
| 5,072,331 A | 12/1991 | Thiel et al. ............. 361/380 X |
| 5,216,278 A | 6/1993 | Lin et al. ...................... 257/688 |
| 5,241,133 A | 8/1993 | Mullen, III et al. ......... 174/52.4 |
| 5,336,931 A | 8/1994 | Juskey et al. ................. 257/787 |
| 5,371,404 A | 12/1994 | Jukey et al. .................. 257/659 |
| 5,436,203 A | 7/1995 | Lin ............................... 437/209 |
| 5,547,730 A | 8/1996 | Weiblen et al. ................ 428/76 |
| 5,570,274 A | * 10/1996 | Saito et al. .................. 361/784 |

(List continued on next page.)

FOREIGN PATENT DOCUMENTS

| | | | |
|---|---|---|---|
| JP | 58-48442 | 3/1983 | ........... H01L/23/28 |
| JP | 59-167037 | 9/1984 | ........... H01L/23/02 |
| JP | 61-29158 | 2/1986 | ........... H01L/23/12 |
| JP | 61029158 | 10/1986 | |
| JP | 62-9639 | 1/1987 | ........... H01L/21/56 |
| JP | 6-326218 | 11/1994 | ........... H01L/23/28 |
| JP | 10-214923 | 8/1998 | ........... H01L/23/28 |
| JP | 10214923 | 11/1998 | |
| WO | WO 97/25847 | 7/1997 | |
| WO | WO 98/48461 | 10/1998 | ....... H01L/31/0203 |

OTHER PUBLICATIONS

Thompson, "All About ESD Plastics", *EE—Evaluation Engineering*, Jul. 1998, 6 pps.

*Primary Examiner*—Richard Chang
(74) *Attorney, Agent, or Firm*—Bever, Hoffman & Harms, LLP; James E. Parsons

(57) ABSTRACT

A method of packaging a device is disclosed. In one embodiment, a substrate including a common voltage plane and a mounting region is provided, with the device mounted to the mounting region. An electrically conductive dam structure is disposed on the surface of the substrate with the electrically conductive dam structure being electrically coupled to the common voltage plane and circumscribing a perimeter of the mounting region. An electrically insulating encapsulant at least partially fills a pocket defined by the substrate and the electrically conductive dam structure, the electrically insulating encapsulant contacting the electrically conductive dam structure. An electrically conductive encapsulant is provided that overlies the electrically insulating encapsulant, the electrically conductive encapsulant being coupled to the electrically conductive dam structure.

10 Claims, 2 Drawing Sheets

U.S. PATENT DOCUMENTS

| | | | |
|---|---|---|---|
| 5,577,319 A | 11/1996 | Knecht | 29/827 X |
| 5,639,989 A | 6/1997 | Higgins, III | 174/35 MS |
| 5,654,243 A | 8/1997 | Yoneda et al. | 29/840 X |
| 5,656,857 A | 8/1997 | Kishita | 257/690 |
| 5,668,406 A | 9/1997 | Egawa | 257/690 |
| 5,677,511 A | 10/1997 | Taylor et al. | 174/52.2 |
| 5,700,981 A | 12/1997 | Tuttle et al. | 174/250 |
| 5,776,798 A | 7/1998 | Quan et al. | 438/112 |
| 5,784,260 A | 7/1998 | Fuller, Jr. et al. | 361/762 X |
| 5,861,680 A | 1/1999 | Yamanaka | 257/793 |
| 5,866,953 A | 2/1999 | Akram et al. | 257/790 X |
| 5,893,723 A | 4/1999 | Yamanaka | 438/65 |
| 5,895,222 A | 4/1999 | Moden et al. | 438/4 X |
| 5,939,784 A | 8/1999 | Glenn | 257/710 |
| 5,950,074 A | 9/1999 | Glenn et al. | 438/121 X |
| 5,962,810 A | 10/1999 | Glenn | 174/52.2 X |
| 5,965,843 A | 10/1999 | Schönberger et al. | 174/35 R |
| 5,972,738 A | 10/1999 | Vongfuangfoo et al. | 438/124 X |
| 5,973,263 A | 10/1999 | Tuttle et al. | 174/52.2 |
| 5,976,912 A | 11/1999 | Fukutomi et al. | 438/110 |
| 5,981,043 A | 11/1999 | Murakami et al. | 428/209 |
| 5,981,314 A | 11/1999 | Glenn et al. | 438/127 |
| 5,986,317 A | 11/1999 | Wiese | 257/433 |
| 5,989,941 A | 11/1999 | Wensel | 438/127 X |
| 6,092,281 A | 7/2000 | Glenn | 29/841 |
| 6,117,705 A | 9/2000 | Glenn et al. | 438/106 |
| 6,126,428 A | 10/2000 | Mitchell et al. | 425/110 |
| 6,195,267 B1 | 2/2001 | MacDonald, Jr. et al. | 361/800 |

\* cited by examiner

METHOD OF MAKING AN ELECTROMAGNETIC INTERFERENCE SHIELD DEVICE

CROSS REFERENCE TO RELATED APPLICATION

This application is a division of an application entitled "Electromagenetic Interference Shield Device and Method," which was assigned application Ser. No. 09/141,936, was filed on Aug. 28, 1998, now U.S. Pat. No. 6,092,281 and is incorporated herein by reference in its entirety.

FIELD OF THE INVENTION

The present invention relates to packaging technology, and more specifically, to an electromagnetic interference shield package and methods for providing and using the electromagnetic interference shield package.

BACKGROUND OF THE INVENTION

Electromagnetic interference (EMI) is the impairment of a wanted electromagnetic signal by an electromagnetic disturbance. Each electronic component operates using a flow of charge carriers, the flow inducing a surrounding electromagnetic field. This surrounding electromagnetic field may cause sufficient noise within surrounding electronic components that the performance of the surrounding electromagnetic components is degraded. EMI is a particular problem in cellular phones in which an antenna emits radio frequencies (RF) which could affect the other circuitry operating in the phone. In order to isolate an electronic component from EMI, EMI shielding has been recently developed.

Lin (U.S. Pat. No. 5,436,203) discusses an EMI shielded device. FIG. 1 is a cross-sectional view of a similar EMI shielded device. In FIG. 1, an electrically insulating encapsulant 38 mechanically protects a semiconductor die 32. The electrically insulating encapsulant 38 is constrained by a dam structure 40 so as not to encapsulate electrically conductive reference pads 18. Reference pads 18 are electrically connected to the reference plane 22 by electrically conductive vias 20. An electrically conductive encapsulant 42 is dispensed over the first encapsulant and is in contact with the reference pads 18. The electrically conductive encapsulant 42 is constrained by a second dam structure 44.

The shielding of device 32 requires the fabrication of two separate dam structures 40 and 44. This requires two separate process steps, one step for the deposition of each dam structure 40 and 44. Furthermore, the size of the package 30 is much larger than the size of the device 32 because a dam structure 40 must surround device 32 while a separate dam structure 44 surrounds the dam structure 40. This double dam structure results in a large footprint of package 30 on a printed circuit board.

It is desirable to reduce the number of process steps in packaging a semiconductor device. It is also desirable to reduce the package size relative to the device size.

SUMMARY OF THE INVENTION

In accordance with the present invention, a package for a device is described. The package includes a substrate having a common voltage plane and a mounting region. The device is mounted to the mounting region. An electrically conductive dam structure is disposed on the upper surface of the substrate. The electrically conductive dam structure is electrically coupled to the common voltage plane and circumscribes a perimeter of the mounting region. An electrically insulating encapsulant at least partially fills a pocket defined by the substrate and the electrically conductive dam structure. The electrically insulating encapsulant contacts the electrically conductive dam structure. An electrically conductive encapsulant overlies the electrically insulating encapsulant and is coupled to the electrically conductive dam structure.

The package in accordance with the present invention shields the device from EMI such as radio frequency ("RF") interference using only one dam structure. Since a double dam structure of the prior art uses an additional dam structure surrounding a primary dam structure, the package of the present invention is substantially smaller (e.g., by 10 to 20 percent or more) compared to the double dam structure package of the prior art.

In accordance with the present invention, a method of packaging a device is described as follows. The method includes providing a substrate having a common voltage plane and a mounting region. The device is mounted to the mounting region. The method includes providing an electrically conductive dam structure disposed on the upper surface of the substrate. The electrically conductive dam structure is electrically coupled to the common voltage plane and circumscribes a perimeter of the mounting region. The method includes providing an electrically insulating encapsulant which at least partially fills a pocket defined by the substrate and the electrically conductive dam structure. The electrically insulating encapsulant contacts the electrically conductive dam structure. The method includes providing an electrically conductive encapsulant that overlies the electrically insulating encapsulant and which is coupled to the electrically conductive dam structure.

The method of fabricating in accordance with the present invention results in an EMI shield device in which only one dam structure is fabricated. The number of dam structures in the conventional double dam structure package may be two. Each dam structure deposition requires a separate process step. Therefore, the method of the present invention reduces the number of steps required to fabricated an EMI shield device.

In accordance with the present invention, a method of using a package includes applying a common voltage to the common voltage plane. A context for the common voltage plane is as follows. The device is mounted to a mounting region of the substrate. An electrically conductive dam structure is disposed on the surface of the substrate around a periphery of the mounting region. The electrically conductive dam structure is electrically coupled to the common voltage plane. The electrically insulating encapsulant at least partially fills a pocket defined by the substrate and the electrically conductive dam structure. An electrically conductive encapsulant overlies the electrically insulating encapsulant. The electrically conductive encapsulant being electrically coupled to the electrically conductive dam structure.

The method of using the device in accordance with the present invention allows for the use of a device that is EMI shielded and is smaller than conventional EMI shielded devices.

These and other objects, features and advantages of the present invention will be more readily apparent from the detailed description of the various embodiments set forth below taken in conjunction with the accompanying drawings.

DETAILED DESCRIPTION OF THE PREFERRED EMBODIMENTS

Several elements in the following figures are substantially similar. Therefore similar reference numbers are used to represent substantially similar elements.

Figure 1:
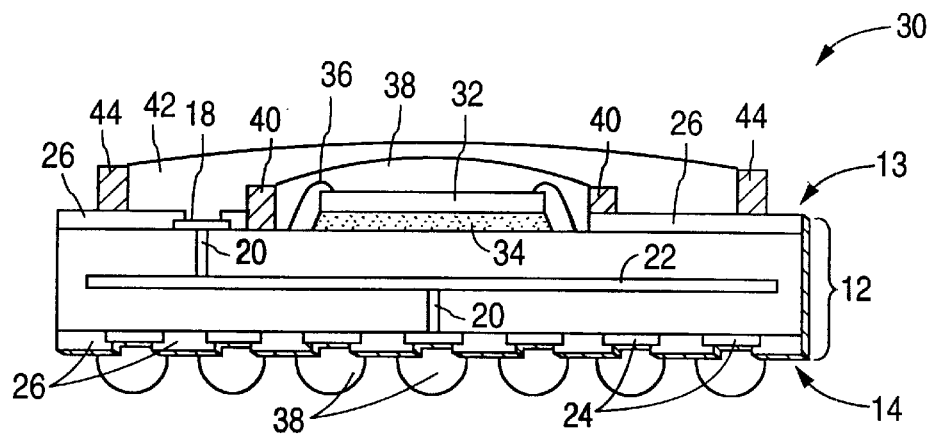
FIG. 1 is a cross-sectional view of an EMI shielded device in accordance with the prior art.
Figure 2:
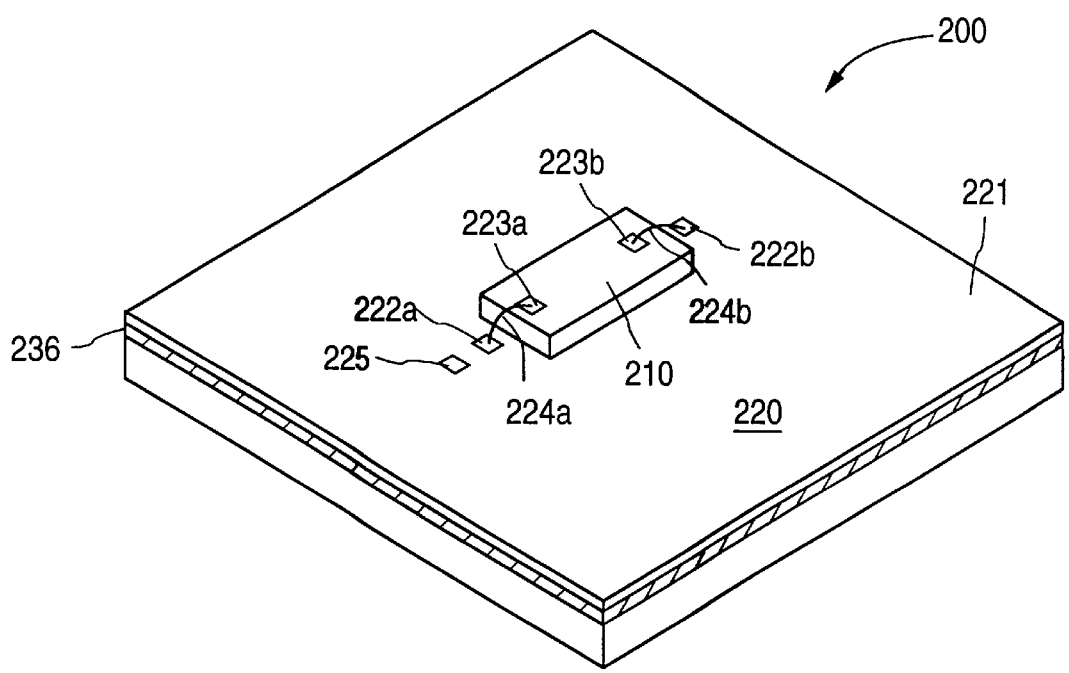
FIG. 2 is an isometric view of a package having a device mounted to a surface of a substrate during packaging in accordance with the present invention.

FIG. 2 is an isometric view of a package 200 having a device 210 mounted to an upper surface 221 of a substrate 220 during packaging in accordance with the present invention. Device 210 may be a semiconductor die which may contain circuitry sensitive to EMI.

Figure 4:
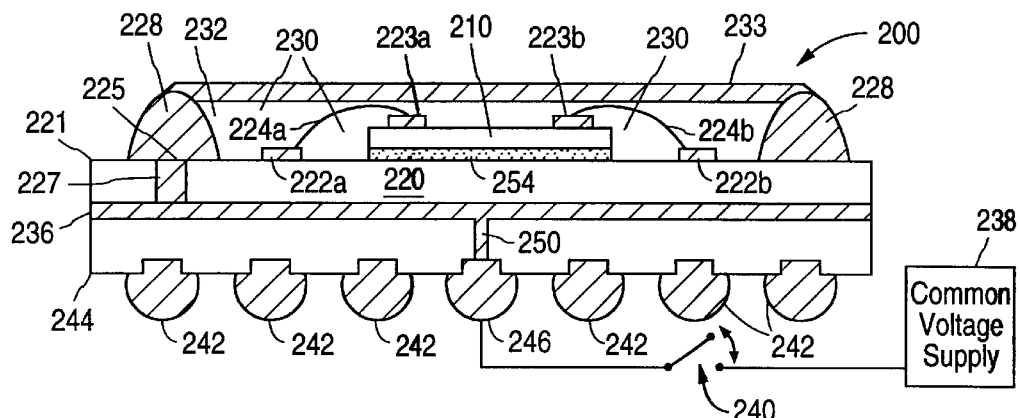
FIG. 4 is a cross-sectional view of the package of FIG. 3 along cross-section line 4—4 of FIG. 3.

Substrate 220 has contact regions, such as bond pads 222a and 222b, formed on upper surface 221. Device 210 has corresponding contact regions, such as bond pads 223a and 223b, coupled to circuitry (not shown) within device 210. Leads, such as bond wires 224a and 224b, electrically couple bond pads 223a and 223b to respective bond pads 222a and 222b. Bond pads 222a and 222b are electrically coupled to corresponding solder balls 242 (FIG. 4) on the lower surface 244 of substrate 220 (FIG. 4). Alternatively, device 210 is electrically connected to substrate 220 in a leadless fashion such as is described in detail hereinafter with reference to FIG. 5.

Substrate 220 has a common voltage contact region, such as a ground via surface 225, on upper surface 221. Ground via surface 225 may be connected to a common voltage plane, such as a ground plane 236.

Figure 3:
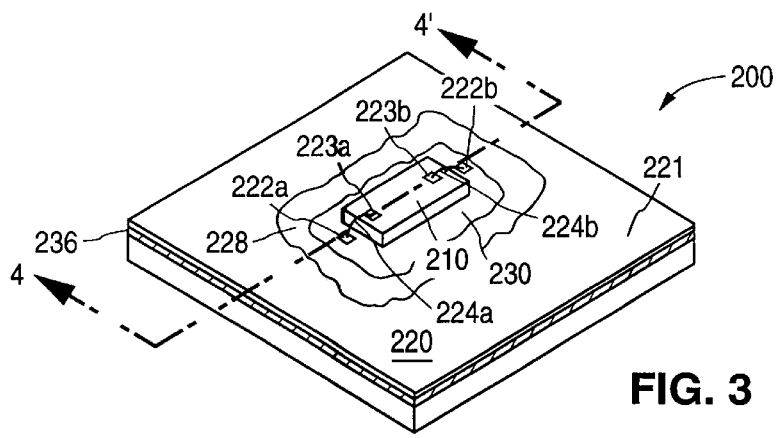
FIG. 3 is an isometric view of the package of FIG. 2 having an electrically conductive dam structure dispensed around a periphery of the device to define a pocket with the substrate.

FIG. 3 is an isometric view of package 200 having an electrically conductive dam structure 228 dispensed around a periphery of device 210 to define a pocket 230 with substrate 220. Electrically conductive dam structure 228 may be deposited as a high viscosity liquid around the perimeter of device 210 using, for example, a dispense system such as an MRSI 375-3S dispenser produced by MRS Technology, Inc., located at 10 Elizabeth Drive, Chemlsford, Mass. Electrically conductive dam structure 228 circumscribes device 210, bond pads 222a and 222b and bond wires 224a and 224b. Electrically conductive dam structure 228 is disposed over, and in contact with, ground via surface 225.

Electrically conductive dam structure 228 is composed of an electrically conductive material such as, for example, an epoxy resin with electrically conductive fillers. The electrically conductive fillers may be, for example, carbon (approximately 5% by weight of the resin compound) and silver (approximately 20% by weight of the resin compound) Such an epoxy resin with conductive fillers may be supplied by Dexter Electronics Materials, 9938 Via Pasar, San Diego, 92126 under material identification number QMIDW1193-588.

However, one skilled in the art will recognize that the filler to resin weight ratio may be altered to obtain a desired electrically conductivity. For example, the filler to resin weight ratio may vary from 5% or less to 50% or more. Package 200 also includes other packaging elements that are not shown in FIG. 3 for clarity. These packaging elements are shown and described with reference to FIG. 4.

FIG. 4 is a cross-sectional view of package 200 along cross-section line 4—4 of FIG. 3. Ground via 227 connects ground via surface 225 to ground plane 236. An electrically insulating encapsulant 232 (e.g., epoxy) is deposited within the pocket 230 defined by the electrically conductive dam structure 228 and substrate 220 using, for example, an MRSI 375-3S dispense system. The electrically insulating encapsulant 232 at least partially fills the pocket such that device 210 and bond wires 224a and 224b are mechanically supported, protected, and electrically insulated.

An electrically conductive encapsulant 233 covers the electrically insulating encapsulant 232 and is electrically connected to electrically conductive dam structure 228. The electrically conductive encapsulant 233 is deposited, using, for example, the MRSI 375-3S dispense system, such that the electrically conductive encapsulant 233 is electrically coupled to electrically conductive dam structure 228. The electrically conductive encapsulant may be of a material similar to electrically conductive dam structure 228 and may be of such a thickness that the sheet resistance is approximately 1000 ohms/cm$^2$.

Figure 5:
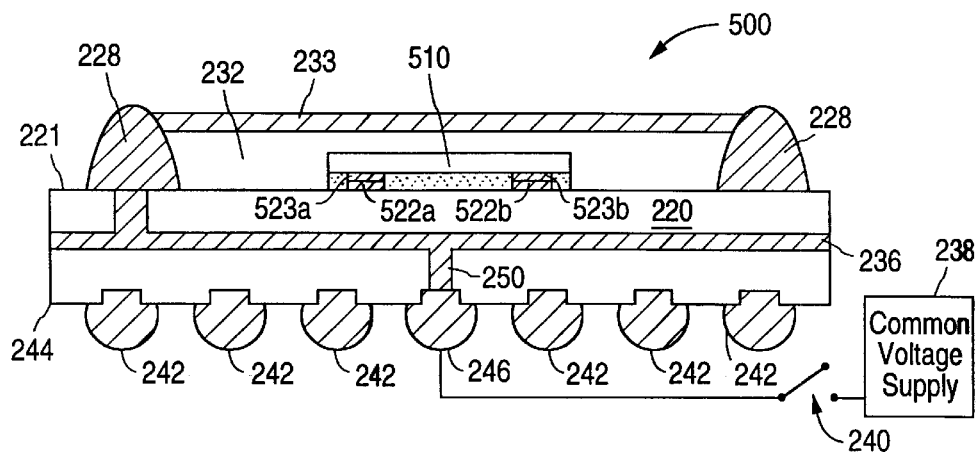
FIG. 5 is a cross-sectional view of a package having a flip chip mounted device in accordance with the present invention.

During operation of device 210, a common voltage supply, such as ground, may be optionally coupled to ground plane 236. This optional coupling is represented by a switch 240 being closed. However, during packaging, the voltage level on ground plane 236 may also float (switch 240 is open). The common voltage supply 238 is connected to ground plane 236, as shown in FIGS. 4 and 5, through a via 250. Via 250 electrically connects the ground plane 236 to solder ball 246, which acts as an input pin for the voltage supplied by common voltage supply 238. Ground plane 236, ground via 227, electrically conductive dam structure 228, and electrically conductive encapsulant 233 are all at a common voltage (either by floating or being coupled to the common voltage source 238) and substantially encapsulate device 210. Device 210 is thus substantially shielded from EMI.

FIG. 5 is a cross-sectional view of a package 500 having a flip chip mounted device 510 in accordance with the present invention. Package 500 is structured similar to package 200 of FIGS. 2–4 except that a flip chip mounted device 510, not adhesively attached and wire bonded device 210, is mounted to upper surface 221 of substrate. Bond wires 224a and 224b are absent because flip chip mounted device 510 has terminals 523a and 523b directly connected to terminals 522a and 522b on substrate 220. Terminals 522a and 522b are electrically coupled to corresponding solder balls 242 on the lower surface 244 of substrate 220.

A method of manufacturing package 200 is now described. The steps described below are not chronologically related to each other unless expressly described below.

Device 210 is mounted to a mounting region 254 (FIG. 4) of substrate 220. The "mounting region" is defined as the region to which device 210 has been, or is to be, mounted. Electrically conductive dam structure 228 is deposited around the outer periphery of mounting region 254. After electrically conductive dam structure 228 is deposited, electrically conductive dam structure 228 may be exposed to ultra violet light (e.g., 310 nanometers wavelength) until electrically conductive dam structure 228 is gelled.

After device 210 is mounted and electrically conductive dam structure 228 is deposited, electrically insulating encapsulant 232 is deposited into pocket 230 so as to at least partially fill pocket 230 and so as to cover bond wires 224a and 224a and device 210. After depositing the electrically insulating encapsulant 232, electrically insulating encapsulant 232 may also be gelled by, for example, exposure to ultra violet light for 30 seconds.

After, electrically conductive dam structure 228 and electrically insulating encapsulant 232 are deposited, electrically conductive encapsulant 233 is deposited over electrically insulating encapsulant 232 in such a way that electrically conductive encapsulant 233 is electrically coupled to electrically conductive dam structure 228.

Electrically conductive dam structure 228, electrically insulating encapsulant 232 and electrically conductive encapsulant 233 may be cured after depositing electrically conductive encapsulant 233. Curing may occur by exposure to a temperature of approximately 80 degrees Celsius for 20 minutes followed by exposure to a temperature of approximately 150 degrees Celsius for 40 minutes. Package 500 of FIG. 5 is made using substantially the same technique as described above in reference to package 200 of FIG. 4, except that device 510 of FIG. 5 is mounted to substrate 220 using a flip chip interconnection.

The above described packages 200 and 500 have only one dam structure compared to the two of the conventional double dam structure package. This eliminates the need to have a separate processing step for depositing a second dam structure. Therefore, the number of processing steps to package device 210 (or 510) is reduced compared to the conventional double dam structure package. Furthermore, the size of the package 200 (or 500) is reduced compared to the double dam structures of the prior art EMI shielding package because a second dam structure is not deposited around electrically conductive dam structure 228. This reduces the size of the package (e.g., by 10 to 20% or more) compared to the double dam structure package.

Having thus described the various embodiments, persons skilled in the art will recognize that changes may be made in form and detail without departing from the spirit and scope of the invention.

For example, although one ground via 227 is described, two or more ground vias will suffice. Even zero ground vias are sufficient if the electrically conductive encapsulant 233 or electrically conductive dam structure 228 is independently coupled to a common voltage supply. Zero ground vias are also sufficient if the dam structure 228 is not coupled to a voltage supply, but is permitted to float.

Although only one device 210 is shown circumscribed by electrically conductive dam structure 228, two or more devices may be circumscribed by electrically conductive dam structure 228 to be EMI shielded. Although only two leads, bond wires 224a and 224b, are described, device 210 may have many more leads.

Thus the invention is limited only by the following claims.

I claim:

1. A method of packaging a device comprising:
   providing a substrate including a common voltage plane and a mounting region, the device mounted to the mounting region;
   providing an electrically conductive dam structure disposed on a surface of the substrate, the electrically conductive dam structure electrically coupled to the common voltage plane and circumscribing a perimeter of the mounting region;
   providing an electrically insulating encapsulant at least partially filling a pocket defined by the substrate and the electrically conductive dam structure, the electrically insulating encapsulant contacting the electrically conductive dam structure; and
   providing an electrically conductive encapsulant overlying the electrically insulating encapsulant, the electrically conductive encapsulant coupled to the electrically conductive dam structure;
   curing the electrically conductive encapsulant, the electrically insulating encapsulant, and the electrically conductive dam structure;
   floating a voltage on the common voltage plane.

2. The method of claim 1, wherein said providing the electrically conductive dam structure on the substrate comprises depositing an electrically conductive epoxy compound in a form of a dam structure on the substrate.

3. The method of claim 2, wherein said providing the electrically insulating encapsulant comprises depositing an insulating epoxy within the pocket defined by the device, the substrate and the electrically conductive dam structure.

4. The method of claim 1, wherein said providing the electrically insulating encapsulant includes constraining said electrically insulating encapsulant within said electrically conductive dam structure.

5. A method of making a package for a device, the method comprising:
   providing a substrate having first and second opposed sides, with an electrically conductive plane disposed therebetween and an electrically conductive via extending from the first side to the electrically conductive plane;
   mounting the device on the first side of the substrate and electrically connecting the device to the substrate;
   applying an electrically conductive dam on the first side of the substrate so as to overlay the via, surround a portion of the first side of the substrate, and define a pocket, wherein the device is within the pocket; and
   applying an electrically insulating encapsulant over the device and within the pocket;
   applying an electrically conductive encapsulant onto the electrically insulating encapsulant, wherein the electrically conductive encapsulant is electrically connected to the electrically conductive dam.

6. The method of claim 5, wherein the electrically insulating encapsulant is applied so as to contact the electrically conductive dam.

7. The method of claim 6, wherein the substrate includes an electrically conductive path between the plane and the second side of the substrate, and further comprising mounting at least one solder ball on the second side of the substrate, wherein said solder ball is in electrical communication with the path.

8. The method of claim 5, wherein the electrically insulating encapsulant is applied so as to contact the electrically conductive dam.

9. The method of claim 8, wherein the device is mounted in a flip chip style.

10. The method of claim 8, further comprising electrically connecting at least one bond wire between the device and the substrate.

* * * * *